United States Patent [19]

Cain

[11] Patent Number: 5,433,823

[45] Date of Patent: Jul. 18, 1995

[54] SELECTIVE DRY-ETCHING OF BI-LAYER PASSIVATION FILMS

[76] Inventor: John L. Cain, 2505 Kline Cir., Schertz, Tex. 78154

[21] Appl. No.: 129,520

[22] Filed: Sep. 30, 1993

[51] Int. Cl.$^6$ ............................................. H01L 21/00
[52] U.S. Cl. .................................................. 156/662.1
[58] Field of Search ................ 156/643, 646, 662, 657

[56] References Cited

U.S. PATENT DOCUMENTS

| | | | |
|---|---|---|---|
| 4,372,034 | 2/1983 | Bohr | 29/577 C |
| 4,484,979 | 11/1984 | Stocker | 156/643 |
| 4,580,330 | 4/1986 | Pollack et al. | 357/50 |
| 4,690,728 | 9/1987 | Tsang et al. | 156/643 |
| 5,013,398 | 5/1991 | Long | 156/643 |
| 5,164,331 | 11/1992 | Lin et al. | 437/192 |
| 5,225,363 | 7/1993 | Reismenschneider et al. | 437/47 |

*Primary Examiner*—R. Bruce Breneman
*Assistant Examiner*—George Goudreau
*Attorney, Agent, or Firm*—Burns, Doane, Swecker & Mathis

[57] ABSTRACT

This invention is directed to a plasma etching process for the etching of bi-layer passivation films comprising silicon nitride and silicon oxide wherein the etching gas is a selectivity enhancing ratio of gases selected from the group consisting of $CHF_3/SF_6$, $CHF_3/O_2$, and $CHF_3/C_2F_6$.

13 Claims, No Drawings

SELECTIVE DRY-ETCHING OF BI-LAYER PASSIVATION FILMS

FIELD OF THE INVENTION

The present invention relates to a method of manufacturing semiconductor devices, and more particularly, to a method of etching a bi-layer passivation film used to protect such devices.

BACKGROUND OF THE INVENTION

After patterning the final metal layer, a passivation layer (or film) is deposited over the entire silicon wafer comprising many semiconductor devices. The passivation film serves to insulate and protect the device from contaminates, moisture and physical damage.

The passivation film preferably consists of two layers. A silicon nitride layer is the protective layer, but because silicon nitride is brittle, a preliminary coating of silicon oxide is formed on the wafer to cushion the transition of stresses to the subsequently deposited nitride. The thickness of the silicon oxide layer is usually of the order of about one-half to one-third the thickness of the silicon nitride layer.

The passivation film is coated with a final photo-resist layer, sometimes called the PAD mask, which defines a pattern corresponding to regions in the integrated circuit in which electrical contact to the finished circuit will be made.

The contacts on metallic structures, i.e., bonding pads, are large steps in the topography of the device. The bonding pads are preferably multi-layer devices, one layer of which comprises aluminum, or an aluminum alloy, such as Al/Cu for electrical contact. Bonding pads are typically about 100×100 μm in size, generally located on the periphery of the circuit, and separated by a space of about 50–100 μ m. Wet etching can be used for such a large area but dry etching is preferred.

Since the passivation film is a bi-layer film, and the bonding pads are preferably multi-layer structures, one typically used multi-step masking and etching steps. However, in a more efficient single mask process, the bonding pads are opened by sequentially etching the silicon nitride layer, the silicon oxide layer and a top most layer of the bonding pad which is generally TiW. TiW is well-known for its use as a diffusion barrier.

A problem can develop in single mask etching of the bi-layer passivation film, if the etch rate of the photo-resist is equal to or greater than the etch rate of any layer in the passivation film. Defining the selectivity between process A and process B as [the rate of process A]/[the rate of process B], the art is concerned about selectivities between nitride to resist and oxide to resist which are less than two, and particularly concerned about selectivities closer to one.

The selectivity of nitride/resist and oxide/resist are in the range of 1.0–1.7 at 70° C. dry-etching with $SF_6$. Thus, in order to etch a 10,000 angstrom layer of nitride a 5,000 layer of oxide and a 750 layer of TiW, one would consume as much as 15,000 angstroms of resist. With 30 % overetch, the total resist loss may reach 2 microns. The typical thickness of the resist coating varies with the topography. Over-step features on the device such as bonding pads, the resist layer is typically less than 2 microns. Consequently, the etching process could remove all resist and substantial nitride at the exposed edges of step features on the device. In this connection, reference is made to S. Wolf, et at., "Silicon Processing for the VLSI Era", Vol. 1, pp. 423–440, published by the Lattice Press, Sunset Beach, Calif. (1986). The latter is hereafter referred to as Reference "1" and it is herein incorporated by reference in its entirety as if fully set forth herein in ipsis verbis.

The present invention has found that the selectivity of the dry-etching process depends on the etching conditions, and in particular, the selectivity depends on the gases used as the plasma gas.

It would be advantageous if those process features which cause the selectivity of the process to be simultaneously so close to unity for both the oxide/resist and the nitride/resist, could be found.

It is well-known that dry-etching technology may also be used on other oxide steps such as VIAS, CONTACTS and SPACERS by adjustment of process parameters. Reference "1" at p. 555, reports the same problem with etching the photo-resist due to the lack of selectivity of fluorine-containing gases. It also reports, however, that selectivity with respect to silicon oxide/resist can be obtained using fluorine deficient plasma. The reference suggests adjusting the oxide/resist etch rate by the addition of $O_2$ or $SF_6$ to the fluorocarbon feed gas, such as CHF3. Reference "1" at p. 549 also reports the addition of $O_2$ to $CF_4$ dramatically increases the etch rate of both silicon and silicon oxide. Reference "1" at p. 556 reports that the selectivity of a $CF_4$ isotropic etching process for silicon nitride to silicon oxide is about 21–3, the more "favorable" selectivity is obtained with the use of $NF_3$ plasmas, e.g., about 9–10. H. Kudoh, et al., J. Electrochem. Soc.,Vol. 133, page 1666, 1986, report the use of a plasma gas consisting of $CHF_3$ and $O_2$ to etch silicon oxide.

Dry etching procedures include reactive ion etching (RIE), reactive ion beam etching, electron beam etching, plasma etching, and the like. Common to such dry etching procedures is the use of a reaction chamber wherein the silicon wafer to be etched is placed in a wafer holder. In addition to holding the wafer, the wafer holder is also used to maintain a constant wafer temperature which, among other factors, is important to insure constant etch rates on the wafer.

Suitable wafer holders include electrodes, inert materials and other heat sources and heat sinks. In general, a stream of helium gas is committed to flow through the backside of the wafer holder (the surface of the holder opposite the wafer) to further insure a constant wafer temperature, a procedure which is referred to as "backside cooling". Typically, in backside cooling the flow of helium gas is set to maintain a pressure of about 10–14 torr on the backside of the wafer holder.

Reactors used for dry-etching are typically referred to as "hexodes" or "triodes", characteristic of the 6-electrode reaction chamber and the 3-electrode reaction chamber. Other parameters that impact the reactions occurring in a dry-etch reaction chamber include the surface temperature, the surface electrical potential, the nature of the surface, geometrical aspects of the surface (e.g., the angle of incidence of impinging ions controls whether they are striking the bottom, or the side wall of an etched feature), the plasma gases and their composition, the total pressure in the reaction chamber, the rate of addition of the reactant plasma gases, the power provided to the unit, the excitation frequency, the gas flow rate, geometrical reactor factors, the nature of the discharge gas, and, of course, the etching time. It has been found that a change in a single microscopic parameter typically alters two or more basic plasma parameters and possibly one or more of the surface parameters such as temperature or electrical potential. This makes process development in plasma systems a difficult challenge.

The present invention makes a contribution to the art of dry-etching bi-layer passivation films through the use of novel plasma etching methods.

SUMMARY OF THE INVENTION

This invention is directed to the discovery that the choice of certain specific plasma gases in certain mole ratios enhances the selectivity of a dry-etching process.

Accordingly, in a method of the present invention semiconductor integrated circuit devices are manufactured by a method comprising the steps of:
  forming a passivation film consisting of a first layer of silicon oxide and a second layer of silicon nitride on the surface of said device;
  forming a layer of resist on said passivation film with a predetermined pattern; and
  etching, by means of a plasma reactor, the portions of said passivation film exposed through the apertures in said layer of resist;
  wherein the etching gas in said plasma reactor comprises a selectivity enhancing ratio of gases selected from the group consisting of $CHF_3/SF_6$, $CHF_3/O_2$ and $CHF_3/C_2F_6$.

In another aspect of the present invention, the selectivity of silicon nitride to photo resist and the selectivity of silicon oxide to photoresist are each greater than three when the plasma gas used to dry-etch a passivation layer comprising silicon nitride and silicon oxide, comprises $CHF_3$ and $SF_6$ is in the mole ratio of from about 5/1 to about 20/1.

In another aspect of the present invention, the selectivity of silicon nitride to photoresist and the selectivity of silicon oxide to photoresist are each greater than two when in a plasma dry-etch of a passivation film comprising layers of silicon nitride and silicon oxide, the plasma gas comprises $CHF_3$ and $O_2$ in the mole ratio of from about 2/1 to about 15/1. For the same reason, the mole ratio of $CHF_3/C_2F_6$ in the plasma gas is in the range from about 1/1 to 3/1.

In a preferred aspect of the present invention the thickness of the silicon oxide layer in said passivation film is in the range from about 3,000 to about 12,000 angstroms, preferably about 6,000 angstroms. In a preferred embodiment of the method the thickness of the silicon nitride layer in the passivation film is in the range from about 6,000 angstroms to about 18,000 angstroms and preferably about 11,000 angstroms. In a preferred embodiment of the method of the present invention the thickness of the photoresist layer is in the range of from about 3,000 to about 30,000 angstroms preferably around 11,000 angstroms.

In a preferred embodiment of the present invention the reactor is a plasma reactor of tri-electrode construction; the pressure in the reactor is in the range from about 160 to about 300 mtorr; and the gas flow rate is in the range of from about 50 to about 250 standard cubic centimeters per minute.

In another preferred embodiment of the method of this invention the integrate circuit comprises a plurality of bonding pads; the location of the photoresist apertures corresponds to the location of the bonding pads and the area of the apertures corresponds to a portion of the area of the bonding pads; and the bonding pads are multi-layer bonding pads, each comprising a final layer of TiW etched in the passivation film etching step.

In one of its composition aspects, this invention is directed to semiconductor devices prepared by the method of this invention.

DETAILED DESCRIPTION OF THE PREFERRED EMBODIMENTS OF THE INVENTION

This invention is directed to the discovery that the selectivity of the dry-etching process for bi-layer passivation films can be enhanced by the choice of certain plasma gases in certain mole ratios. However, prior to describing this invention in more detail, the following terms will first be defined:

The terms "silicon nitride" and "silicon oxide" refer to $Si_3N_4$ and $SiO_2$, respectively. While an oxide layer can be thermally grown on a silicon substrate, such layers are preferably deposited by chemical vapor deposition.

The term "chemical vapor deposition"(CVD) refers to the formation of a non-volatile solid film on a substrate by the reaction of vapor phase chemicals (reactants) that contain the required constituents. The reactant gases are introduced into a reaction chamber and are decomposed and reacted at the heated surface to form a thin film. The conditions required to effect such deposition are well-known in the art. For example, CVD, low pressure chemical vapor deposition (LPCVD), plasma enhanced chemical vapor deposition (PECVD), photon-induced chemical vapor deposition (PHCVD), and the like is described in Reference 1, at pp. 161–197, the disclosure of which is incorporated herein by reference.

Suitable reaction conditions for the deposition of refractory metals, oxides and nitrides by CVD are not critical and any suitable CVD conditions can be used. CVD conditions typically include pressures from a few millitorr to about 10 torr or slightly greater and preferably from about 75 mtorr to about 10 torr and even more preferably from about 100 mtorr to about 5 torr. CVD conditions also typically include reaction temperatures which are sufficient to effectively vaporize the refractory inorganic source materials, and when desired, to allow the refractories to concurrently deposit and adhere to the substrate. Such temperatures can generally range from about 300° C. to about 700° C. More preferably, the temperature for CVD deposition of refractory is from about 400° C. to about 700° C. The specific conditions employed will vary with the particular chemical vapor deposition process used and the skilled artisan is readily capable of making the adjustments to the reaction conditions to effect deposition of the refractory.

Plasma enhanced chemical vapor deposition (PECVD) is a variant of chemical vapor deposition which is characterized not only by pressure, but also by its method of energy input. Rather than relying solely on thermal energy to initiate and sustain chemical reactions, the PECVD of refractory metals uses a RF-induced glow discharge to transfer energy into the reactant gases, thereby allowing the substrate to remain at a lower temperature than in LPCVD processes. Lower substrate temperature is one primary advantage of PECVD and, in fact, PECVD provides a means of depositing refractories on substrates that do not have the thermostability to accept coating by other methods.

In addition, PECVD can enhance the deposition rate of refractory metal when compared to thermal reactions only, and produce films or layers of any compositions and properties. For example, a number of the desirable properties achieved by PECVD of refractories include good adhesion, low pinhole density, good coverage, adequate electrical properties and compatibility with fine-line pattern transfer processes.

The term "dry-etching" refers to etching procedures which do not employ liquids to effect etching (hence "dry"); and which conventionally employ helium backside cooling. Suitable dry etching procedures are well-known in the art and include, by way of example, reactive ion etching, reactive ion beam etching, electron beam etching, plasma etching, and the like. See Reference 1, pp. 539–585, the disclosure of which is incorporated herein by reference.

The term "patterned resist layer" refers to the patterned placement of a resist layer onto any surface which is found on a silicon wafer.

Methodology

Formation of the Passivation Film

The first step in the method of the present invention is the deposition of a bi-layer passivation film on a semiconductor integrated circuit device. Such devices, at this stage of manufacture, would each comprise a small portion of a large silicon wafer. Of particular interest are Very Large Scale Integrated circuit devices (VLSI).

The sequential formation of silicon oxide and silicon nitride layers on the surface of the device is by any means known to those of skill in the art. The preferred CVD methods of depositing oxide and nitride layers have been described above. Particularly preferred is the PECVD of silicon oxide and silicon nitride in the formation of the bi-layer passivation film.

Placement of the Patterned Resist Layer

In the next step of the method a patterned resist layer is formed on the passivation film in a predetermined pattern by conventional lithographic techniques which are well-known in the art and are described, in part, in Reference 1, pp. 407–513, the disclosure of which is incorporated by reference.

A preferred conventional method for placing a patterned resist layer on the surface of the passivation film includes first placing a photoresist layer on the entire surface, placing a patterned chromium mask over the wafer so as to shield the resist layer in the areas where the resist is to be maintained; exposing the wafer to UV light so as to decompose the resist in a predetermined pattern thereby permitting removal of the decomposed resist by a developer solution; and as a final step, treating the surface with developer solution thereby retaining only the patterned resist layer on the surface of the wafer.

The resist material employed to form the patterned resist layer is not critical mid any resist material conventionally employed with dry etching can be employed to form the pattern resist layer. Typical resist materials so employed include, by way of example, Shipley Resist (Shipley Company, Newton, Mass.), G line resist LR (available as TSMR 8900 from Ohka America, Inc., Milpitas, Calif. and the like. The pattern resist layer is formed in a typical thickness of from about 0.5 to about 2 microns.

Etching of the Exposed Passivation Film

After formation of the passivation bi-layer containing a patterned resist layer on the surface of the passivation film, the film is then etched under dryetching conditions to remove the passivation film from all areas exposed through apertures in the photoresist. The particular etching method employed in the present invention is plasma etching.

Plasma etching is conventionally conducted in a plasma reaction chamber at a temperature of from about 10° to 60° C., in a suitable etching gas pressure greater than about 100 militorr. Suitable etching gases for various integrated circuit materials have been reported in Reference 1, at p. 581, the disclosure of which is incorporated by reference. It is reported that suitable etching gases for silicon oxide are $CF_4/H_2$, $C_2F_6$, $C_3F_8$, and $CHF_3$. It is also reported therein that suitable etching gases for silicon nitride are $CF_4/O_2$, $CF_4/H_2$, $C_2F_6$, and $C_3F_8$. in the present invention are those which enhance the selectivity of both silicon oxide and silicon nitride towards photoresist while maintaining good etching properties for the oxide and the nitride per se. Consequently, the gases of the present invention are limited to the etching gas combinations of $CHF_3/SF_6$, $CHF_3/O_2$ and $CHF_3/C_2F_6$.

The silicon wafer containing the passivation layer on which a patterned resist layer has been formed is conventionally placed in a wafer holder, which is preferably an electrode containing internal cooling/heating means (e.g., a water coil) and means to permit helium backside cooling so as to maintain the electrode and hence the silicon wafer at a constant temperature. The electrode arrangement of the plasma reactor is preferably that of a 3-electrode reactor known as the triode. The wafer holder is contained or placed into the plasma reaction chamber which contains means to permit helium backside cooling of the wafer holder. RF power, typically at about 600 watts, is then passed through the electrodes to effect ion generation and hence plasma etching.

During etching the helium gas flow onto the backside of the wafer holder is maintained at about 10 torr. Plasma etching is continued until all of the exposed passivation film is removed from the surface of the silicon wafer which typically requires from about 1 to about 5 minutes; the exact time of which is dependent on factors such as the thickness of the exposed passivation layer, the temperature of the wafer, the output of the RF power source and the etching gas ratio.

The preferred etching gas ratios of the present invention are selected to achieve high selectivity of both nitride to resist and oxide to resist. For example, when the plasma gas is $CHF_3/SF_6$ the mole ratio of the components of the gas will range from about 5/1 to about 20/1 to produce a selectivity of silicon nitride/resist and silicon oxide/resist which are both greater than 3. Similarly, when the etching glass consists of $CHF_3/O_2$, the mole ratio of components of the etching gas are in the ratios of about 2/1 to about 15/1 in order to obtain the selectivity of silicon nitride/resist and silicon oxide/resist both greater than 2. Furthermore, when the etching gas composition is represented by $CHF_3/C_2F_6$, the mole ratio of these gases will range from about 1/1 to about 3/1 in order to achieve the selectivity of both silicon nitride/resist and silicon oxide/resist greater than 2.

Typically, the passivation film is composed of a silicon oxide layer in the range from about 3,000 to about 12,000 angstroms, a silicon nitride layer in the range from about 6,000 to about 18,000 angstroms, and optionally, a TiW layer is present on the bonding pads in a thickness of from about 500 to 1,000 angstroms. The photoresist layer against which the selectivities of the other layers are measured is typically of a thickness in the range between 6,000 to about 18,000 angstroms.

In a preferred embodiment of the invention, the integrated circuit device comprises a plurality of bonding pads. The location of the apertures in the photoresist correspond to the location of the bonding pads and the area of the apertures in the photoresist of each aperture in the photoresist corresponds to a portion of the area of each bonding pad.

EXAMPLE

Example 1.

A silicon wafer having fabricated circuit elements is placed in a plasma CVD reaction chamber (Model T5000 available from Applied Materials, Inc. of Santa Clara, Calif.) suitable for the plasma enhanced deposition of silicon oxide and silicon nitride by conventional means as described, for example, in Reference 1, pp. 171-174, the disclosure of which is incorporated herein by reference. Deposition of silicon oxide (Model TRX200, available from ASM Systems, Inc.) continues until a layer of average thickness of about 5,000 angstroms is formed. Deposition of silicon nitride continues until a layer of average thickness about 9,000 angstroms is formed to complete the bi-layer passivation film.

OFPR-5000 resist (available from TOK, Inc., Tokyo, Japan) is applied onto the passivation film by spin coating using a SVG6000 (available from SVG, Inc. of Santa Clara, Calif.) at a spin rate of approximately 3000 rpm until a thickness of more than one micron is formed.

A chrome pattern mask is placed over the wafer and the wafer is exposed to UV light for approximately 0.75 seconds at room temperature at approximately 40±5% relative humidity using a CANON MPA full wafer alignment System Model MPA 600FA (available from CANON, Inc.). The wafer is then treated with commercially available developer (TMAH available from TOK, Inc.) which is applied by spinning techniques using a SVG6000 spin coater at approximately 800 rpm until the resist layer exposed to UV light is removed.

The wafer is then placed into a wafer holder which comprises an electrode containing an internal cooling means comprising coils through which water can run. The wafer holder is then placed in a triode reaction chamber (Model 650B available from GCA, Inc.) and the chamber is then evacuated. Plasma gas is permitted to flow into the reaction chamber until the pressure reaches approximately 180 millitorr. The temperature of the reaction chamber is maintained at approximately 11° C. A helium cooling pressure approximately 10 torr is maintained on the backside of the wafer. The temperature of the wafer was 11° C.

The process of the present invention was compared to a standard process utilizing a plasma gas consisting of 100% $SF_6$. The process of the present invention was tested using a gas mixture consisting of 50 standard cubic centimeters per minute of $C_2F_6$ and 50 standard cubic centimeters per minute of $CHF_3$, i.e., a one-to-one ratio of $C_2F_6/CHF_3$.

An RF field of approximately 600 watts was passed through the electrodes so as to induce the generation of a plasma within the reaction chamber. The plasma contains cations of the abovementioned plasma gases. The plasma further induces a DC bias (negative charge) on the electrode resulting in a flow of cations to the electrode which contact the surface placed in front of the electrode thereby effecting etching. The RF field is continued only so long as to effect etching of the passivation film (and a TiW layer if one is present) plus an additional etching time called "overetch". Overetch times of 10 to 50% are conventionally used to assure removal of all the exposed passivation layers.

The wafer is removed from the reaction chamber and the resist layer is removed from the wafer by conventional $O_2$ plasma striping to provide for a silicon wafer having opened bonding pads and/or other open features required by the integrated circuit at this stage of manufacture. The results of the comparison test are shown in Table 1.

TABLE 1

| | $SF_6$ | $CHF_3/C_2F_6$ |
|---|---|---|
| Layer Etch Rates | Å/min | Å/min |
| Silicon Nitride | 10022 ± 34.7 | 5641 ± 25.2 |
| Silicon Oxide | 5954 ± 73.7 | 10649 ± 9.3 |
| Resist | 6186 ± 51.2 | 2129 ± 30.3 |
| Selectivity | | |
| Nitride/Resist | 1.6 | 2.6 |
| Oxide/Resist | 1.0 | 5.0 |
| Total Etch Time (50% Overetch) | | |
| Nitride | 81 sec. | 143 sec. |
| Oxide | 26 | 42 |
| Resist Loss: | 16187Å | 6564Å |

Example 2

Etching conditions were the same as in Example 1 except for the stated conditions. The flow rates of $CHF_3$ and $O_2$ were respectively 213 standard cubic centimeters per minute and 38 standard cubic centimeters per minute, i.e. a ratio of $CHF_3/O_2$ of 5.6/1. The total pressure in the reaction chamber was 240 millitorr, and the RF power applied was 600 watts. The integrated circuit device also differed from Example 1 in the presence of a layer of TiW having a thickness of approximately 750 angstroms. The results of the comparison tests are shown in Table 2:

TABLE 2

| | $SF_6$ | $CHF_3/O_2$ |
|---|---|---|
| Layer Etch Rates | Å/min | Å/min |
| Silicon Nitride | 10022 ± 34.7 | 9292 ± 11.6 |
| Silicon Oxide | 5954 ± 73.7 | 11332 ± 11.8 |
| Resist | 6186 ± 51.2 | 4453 ± 11.9 |
| TiW | 2144 ± 11.0 | 1165 ± 7.1 |
| Selectivity | | |
| Nitride/Resist | 1.6 | 2.1 |
| Oxide/Resist | 1.0 | 2.5 |
| Total Etch Time (50% overetch) | | |
| Nitride | 81 | 87 |
| Oxide | 76 | 40 |
| TiW | 32 | 58 |
| Resist Loss: | 19486 | 13730 |

Example 3

In this example, a comparison test is run between the conventional process plasma gas $SF_6$ and the plasma gas mixture of the present invention $SF_6/CHF_3$. Process conditions are the same as described in Example 1, except for a total reactor pressure of 240 millitorr, and RF power level of 700 watts and flow rates for $SF_6$ and $CHF_3$ of 20 standard cubic centimeters per minute and 180 standard cubic centimeters per minute, respectively. Consequently, the ratio of $CHF_3/SF_6$ in this example is 8/1. A layer of TiW of approximately 700 angstroms thickness was again present on the bonding pads. The comparative tests are shown in Table 3:

TABLE 3

| | $SF_6$ | $SF_6/CHF_3$ |
|---|---|---|
| Layer Etch Rates | Å/min | Å/min |
| Silicon Nitride | 10022 ± 34.7 | 11798 ± 16.9 |
| Silicon Oxide | 5954 ± 73.7 | 14447 ± 14.4 |
| Resist | 6186 ± 51.2 | 3584 ± 7.4 |
| TiW | 2144 ± 11.0 | 1832 ± 8.1 |
| Selectivity | | |
| Nitride/Resist | 1.6 | 3.3 |
| Oxide/Resist | 1.0 | 4.0 |
| Total Etch Time (50% Overetch) | | |
| Nitride | 81 | 69 |
| Oxide | 76 | 31 |
| TiW | 32 | 37 |
| Resist Loss: | 19486 | 8183 |

The comparative resist losses shown in Tables 1–3 illustrate the substantial reduction in resist loss obtained by the method of the present invention in comparison to conventional plasma dry-etching. The markedly improved selectivities of nitride and oxide toward resist is evident from tables when the plasma gas mixtures of the present invention are used in selected ratio.

While the invention has been described in terms of various preferred embodiments, the skilled artisan will appreciate the various modifications, substitutions, omissions and changes which may be made without departing from the spirit thereof. The descriptions of subject matter in this disclosure are illustrative of the invention and are not intended to be construed as limitations upon the scope of the invention.

What is claimed is:

1. A method of manufacturing a semiconductor integrated circuit device comprising the steps of:
   forming a passivation film consisting of a first layer of silicon oxide and a second layer of silicon nitride on the surface of said device;
   forming a patterned resist layer on said passivation film; and
   etching by means of a plasma reactor, the portions of said passivation film exposed through apertures in said patterned resist layer;
   wherein the etching gas in said plasma reactor comprises $CHF_3/SF_6$ wherein the ratio of $CHF_3/SF_6$ is in the range of from 5/1 to 20/1 and the selectivity of nitride/resist and oxide/resist are both greater than 3.

2. The method of claim 1 wherein the thickness of said oxide layer is in the range of from about 3,000 to about 12,000 angstroms, the thickness of said nitride layer is in the range of from about 6,000 to about 18,000 angstroms, and the thickness of said resist layer is in the range of from about 3,000 to about 30,000 angstroms.

3. The method of claim 2 wherein said oxide layer and said nitride layer are PECVD.

4. The method of claim 1 wherein said plasma reactor is a triode reactor.

5. The method of claim 1 wherein the process conditions comprise a total pressure in the range of from about 160 to about 300 millitorr and a total gas flow rate of from about 150 to about 250 standard cubic centimeters per minute.

6. A method of manufacturing a semiconductor integrated circuit device, which includes a plurality of bonding pads, comprising the steps of:
   forming a passivation film consisting of a first layer of silicon oxide and a second layer of silicon nitride on the surface of said device;
   forming a patterned resist layer on said passivation film; and
   etching by means of a plasma reactor, the portions of said passivation film exposed through apertures in said patterned resist layer;
   wherein the etching gas in said plasma reactor comprises a selectivity enhancing ratio of gases selected from the group consisting of $CHF_3/SF_6$ and $CHF_3/C_2F_6$, wherein the location of each said aperture corresponds to the location of a bonding pad and the area of each said aperture corresponds to a portion of the area of a bonding pad, and wherein said bonding pads are multi-layer bonding pads, with each bonding pad having a final layer of TiW which is etched in said etching step.

7. The method of claim 6 wherein the ratio of $CHF_3/SF_6$ is in the range of from 5/1 to 20/1 and the selectivity of nitride/resist and oxide/resist are both greater than 3.

8. The method of claim 6 wherein the ratio of $CHF_3/C_2F_6$ is in the range of from about 1/1 to about 15/1 and the selectivity of nitride/resist and oxide/resist are both greater than 2.

9. The method of claim 6 wherein the thickness of said oxide layer is in the range of from about 3,000 to about 12,000 angstroms, the thickness of said nitride layer is in the range of from about 6,000 to about 18,000 angstroms, and the thickness of said resist layer is in the range of from about 3,000 to about 30,000 angstroms.

10. The method of claim 9 wherein said oxide layer and said nitride layer are PECVD.

11. The method of claim 7 wherein said plasma reactor is triode reactor.

12. The method of claim 8 wherein said plasma reactor is triode reactor.

13. The method of claim 6 wherein the process conditions comprise a total pressure in the range of from about 160 to about 300 millitorr and a total gas flow rate of from about 150 to about 250 standard cubic centimeters per minute.

* * * * *